United States Patent
Maru et al.

(10) Patent No.: US 11,714,113 B2
(45) Date of Patent: Aug. 1, 2023

(54) AUTO-CENTERING OF SENSOR FREQUENCY OF A RESONANT SENSOR

(71) Applicant: Cirrus Logic International Semiconductor Ltd., Edinburgh (GB)

(72) Inventors: Siddharth Maru, Austin, TX (US); Vadim Konradi, Austin, TX (US); Matthew Beardsworth, Austin, TX (US); Tejasvi Das, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/894,429

(22) Filed: Aug. 24, 2022

(65) Prior Publication Data
US 2022/0404409 A1 Dec. 22, 2022

Related U.S. Application Data (63) Continuation of application No. 16/600,255, filed on Oct. 11, 2019, now Pat. No. 11,474,135.
(60) Provisional application No. 62/828,566, filed on Apr. 3, 2019.

(51) Int. Cl.
*G01R 27/28* (2006.01)
*G01D 5/243* (2006.01)

(52) U.S. Cl.
CPC .......... *G01R 27/28* (2013.01); *G01D 5/243* (2013.01)

(58) Field of Classification Search
CPC ........ G01R 27/28; G01R 23/12; G01D 5/243; G01D 5/2006; G01D 5/202; G06F 3/0416; G06F 3/044; G06F 3/045; G06F 3/0488

USPC .......................................................... 324/655
See application file for complete search history.

(56) References Cited

U.S. PATENT DOCUMENTS

| 5,514,337 A | 5/1996 | Groger et al. |
|---|---|---|
| 11,474,135 B2 * | 10/2022 | Maru ..................... G01D 5/243 |
| 2008/0158165 A1 | 7/2008 | Geaghan et al. |
| 2009/0267617 A1 * | 10/2009 | Seyfi ................... G01N 27/023 324/655 |
| 2016/0062511 A1 | 3/2016 | Park et al. |
| 2017/0371473 A1 | 12/2017 | David et al. |
| 2019/0302922 A1 | 10/2019 | Das et al. |

FOREIGN PATENT DOCUMENTS

| EP | 2765391 A2 | 8/2014 |
|---|---|---|
| WO | 20200247202 A1 | 12/2020 |

OTHER PUBLICATIONS

Combined Search and Examination Report under Sections 17 and 18(3), UKIPO, Application No. GB2003895.6, dated Jul. 6, 2020.
Combined Search and Examination Report under Sections 17 and 18(3), UKIPO, Application No. GB2112375.7, dated Nov. 8, 2021.

* cited by examiner

*Primary Examiner* — Farhana A Hoque
(74) *Attorney, Agent, or Firm* — Jackson Walker L.L.P.

(57) ABSTRACT

A system may include a resistive-inductive-capacitive sensor, a driver configured to drive the resistive-inductive-capacitive sensor at a driving frequency, and a measurement circuit communicatively coupled to the resistive-inductive-capacitive sensor and configured to determine a measured change in a resonant frequency of the resistive-inductive-capacitive sensor and based on the measured change, modify the driving frequency.

27 Claims, 7 Drawing Sheets

AUTO-CENTERING OF SENSOR FREQUENCY OF A RESONANT SENSOR

RELATED APPLICATIONS

The present disclosure is a continuation of U.S. Non-Provisional patent application Ser. No. 16/600,255, filed Oct. 11, 2019, which claims priority to U.S. Provisional Patent Application Ser. No. 62/828,566, filed Apr. 3, 2019, which is incorporated by reference herein in its entirety.

FIELD OF DISCLOSURE

The present disclosure relates in general to electronic devices with user interfaces, (e.g., mobile devices, game controllers, instrument panels for vehicles, machinery, and/or appliances, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices that are waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size.

SUMMARY

In accordance with the teachings of the present disclosure, the disadvantages and problems associated with sensing of human-machine interface interactions in a mobile device may be reduced or eliminated.

In accordance with embodiments of the present disclosure, a system may include a resistive-inductive-capacitive sensor, a driver configured to drive the resistive-inductive-capacitive sensor at a driving frequency, and a measurement circuit communicatively coupled to the resistive-inductive-capacitive sensor and configured to determine a measured change in a resonant frequency of the resistive-inductive-capacitive sensor and based on the measured change, modify the driving frequency.

In accordance with these and other embodiments of the present disclosure, a method may include, in a system comprising a resistive-inductive-capacitive sensor and a driver configured to drive the resistive-inductive-capacitive sensor at a driving frequency, determining a measured change in a resonant frequency of the resistive-inductive-capacitive sensor and based on the measured change, modifying the driving frequency.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Each of FIGS. 4A-4C illustrates a diagram of selected components of an example resonant phase sensing system, in accordance with embodiments of the present disclosure.

DETAILED DESCRIPTION

Figure 1:
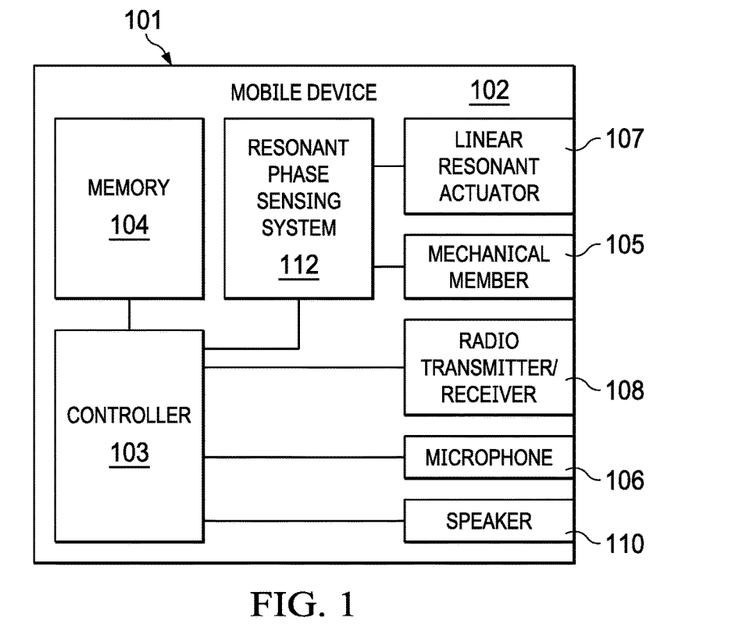
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMS) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual interface (e.g., a virtual button), which, to a user of mobile device 102, has a look and feel of a mechanical button or other mechanical interface of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sensing system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted above in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual interfaces each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Although the foregoing contemplates a resonant phase sensing system 112 for use in a mobile device 102, the resonant phase sensing system 112 may be used in any other suitable host device. A host device may include without limitation, a portable and/or battery-powered mobile computing device (e.g., a laptop, notebook, or tablet computer), a gaming console, a remote control device, a home automation controller, a domestic appliance (e.g., domestic temperature or lighting control system), a toy, a machine (e.g., a robot), an audio player, a video player, and a mobile telephone (e.g., a smartphone).

Figure 2:
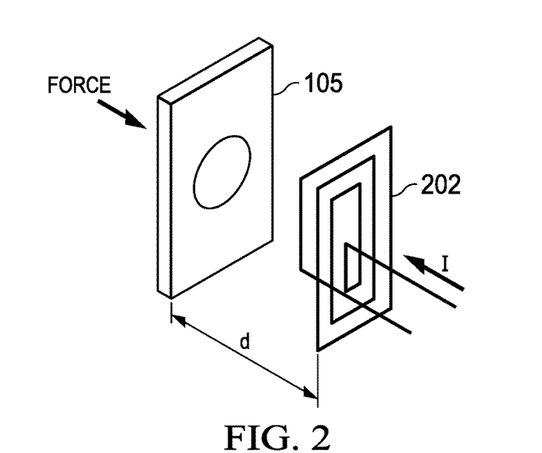
FIG. 2 illustrates a mechanical member separated by a distance from an inductive coil, in accordance with embodiments of the present disclosure.
Figure 3:
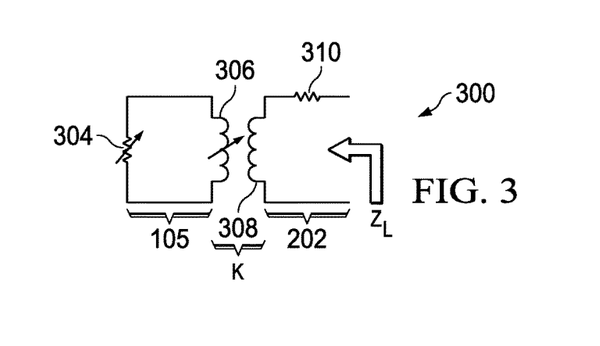
FIG. 3 illustrates selected components of a model for a mechanical member and inductive coil that may be used in an inductive sensing system, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of a model for mechanical member 105 and inductive coil 202 that may be used in an inductive sensing system 300, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

Figure 4A:
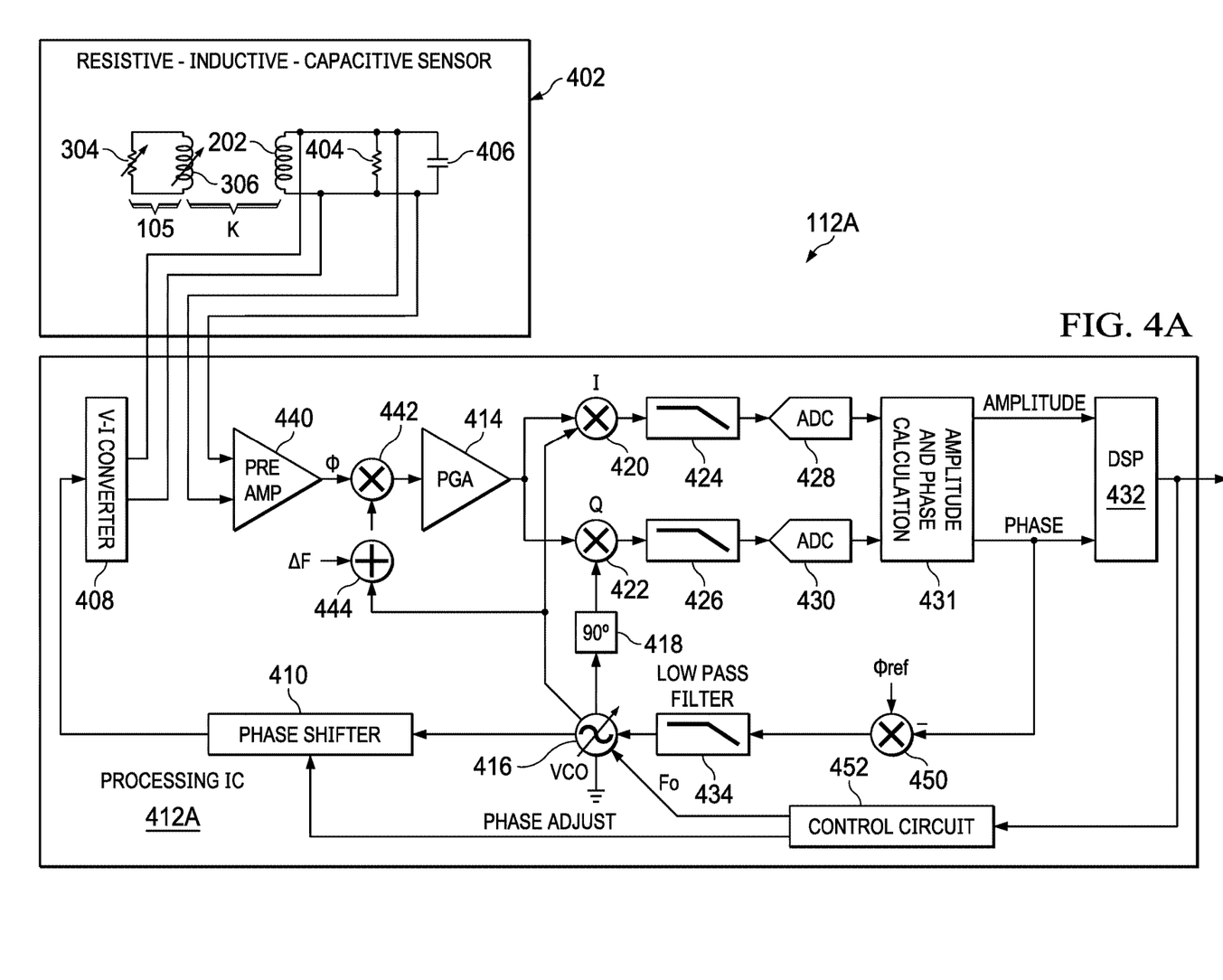

FIG. 4A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown in FIG. 4A, resonant phase sensing system 112A may include a resistive-inductive-capacitive sensor 402 and a processing integrated circuit (IC) 412A.

As shown in FIG. 4A, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4A to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

Processing IC 412A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 412A may be configured to determine an occurrence of a physical interaction (e.g., press or release of a virtual button) associated with a human-machine interface associated with mechanical member 105 based on the phase information.

As shown in FIG. 4A, processing IC 412A may include a phase shifter 410, a voltage-to-current converter 408, a preamplifier 440, an intermediate frequency mixer 442, a combiner 444, a programmable gain amplifier (PGA) 414, an oscillator 416, a phase shifter 418, an amplitude and phase calculation block 431, a DSP 432, a low-pass filter 434, a combiner 450, and a control circuit 452. Processing IC 412A may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412A is configured to measure the phase information using the coherent incident/quadrature detector.

Phase shifter 410 may include any system, device, or apparatus configured to receive an oscillation signal generated by processing IC 412A (as explained in greater detail below) and, based on a control signal PHASE ADJUST received from control circuit 452, phase shift such oscillation signal such that at an operating frequency of resonant phase sensing system 112, an incident component of a sensor signal ϕ generated by pre-amplifier 440 is approximately equal to a quadrature component of sensor signal ϕ, so as to provide common mode noise rejection by a phase detector implemented by processing IC 412A, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal ϕ which may be processed by processing IC 412A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 440 may receive sensor signal ϕ and condition sensor signal ϕ for frequency mixing, with mixer 442, to an intermediate frequency Δf combined by combiner 444 with an oscillation frequency generated by oscillator 416, as described in greater detail below, wherein intermediate frequency Δf is significantly less than the oscillation frequency. In some embodiments, preamplifier 440, mixer 442, and combiner 444 may not be present, in which case PGA 414 may receive sensor signal ϕ directly from resistive-inductive-capacitive sensor 402. However, when present, preamplifier 440, mixer 442, and combiner 444 may allow for mixing sensor signal ϕ down to a lower intermediate frequency Δf which may allow for lower-bandwidth and more efficient ADCs (e.g., ADCs 428 and 430 of FIGS. 4A and 4B and ADC 429 of FIG. 4C, described below) and/or which may allow for minimization of phase and/or gain mismatches in the incident and quadrature paths of the phase detector of processing IC 412A.

In operation, PGA 414 may further amplify sensor signal ϕ to condition sensor signal ϕ for processing by the coherent incident/quadrature detector. Oscillator 416 may generate an oscillation signal to be used as a basis for the signal driven by voltage-to-current converter 408, as well as the oscillation signals used by mixers 420 and 422 to extract incident and quadrature components of amplified sensor signal ϕ. As shown in FIG. 4A, mixer 420 of the incident channel may use an unshifted version of the oscillation signal generated by oscillator 416, while mixer 422 of the quadrature channel may use a 90-degree shifted version of the oscillation signal phase shifted by phase shifter 418. As mentioned above, the oscillation frequency of the oscillation signal generated by oscillator 416 may be selected based on a resonant frequency of resistive-inductive-capacitive sensor 402 (e.g., may be approximately equal to the resonant frequency of resistive-inductive-capacitive sensor 402). Accordingly, as described in greater detail below, control circuit 452 may generate a control signal indicative of oscillation frequency $f_0$ and communicate such control signal to oscillator 416 in order to cause oscillator 416 to generate the oscillation signal at oscillation frequency $f_0$.

In some embodiments, oscillator 416 may be implemented with a voltage-controlled oscillator (VCO), in which case control circuit 452 may generate a voltage indicative of oscillation frequency $f_0$ as the control signal communicated to oscillator 416. In other embodiments, oscillator 416 may be implemented with a digitally-controlled oscillator (DCO), in which case control circuit 452 may generate a digital code indicative of oscillation frequency $f_0$ as the control signal communicated to oscillator 416.

In the incident channel, mixer 420 may extract the incident component of amplified sensor signal ϕ, low-pass filter 424 may filter out the oscillation signal mixed with the amplified sensor signal ϕ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal ϕ, low-pass filter 426 may filter out the phase-shifted oscillation signal mixed with the amplified sensor signal ϕ to generate a direct current (DC) quadrature component, and ADC 430 may convert such DC quadrature component into an equivalent quadrature component digital signal for processing by amplitude and phase calculation block 431.

Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 105 relative to resistive-inductive-capacitive sensor 402, which may be indicative of an occurrence of a physical interaction (e.g., press or release of a virtual button or other interaction with a virtual interface) associated with a human-machine interface associated with mechanical member 105 based on the phase information. DSP 432 may also generate an output signal indicative of the displacement. In some embodiments, such output signal may comprise a control signal for controlling mechanical vibration of linear resonant actuator 107 in response to the displacement.

Combiner 450 may subtract the phase information generated by amplitude and phase calculation block 431 from a reference phase $\phi_{ref}$ in order to generate an error signal that may be received by low-pass filter 434. Low-pass filter 434 may low-pass filter the error signal, and such filtered error signal may be applied to oscillator 416 to modify the frequency of the oscillation signal generated by oscillator 416, in order to drive sensor signal ϕ towards reference phase $\phi_{ref}$. As a result, sensor signal ϕ may comprise a transient decaying signal in response to a "press" of a virtual button (or other interaction with a virtual interface) associated with resonant phase sensing system 112A as well as another transient decaying signal in response to a subsequent "release" of the virtual button (or other interaction with a virtual interface). Accordingly, low-pass filter 434 in connection with oscillator 416 may implement a feedback control loop that may track changes in operating parameters of resonant phase sensing system 112A by modifying the driving frequency of oscillator 416.

Control circuit 452 may comprise any suitable system, device, or apparatus configured to generate a control signal indicative of a phase shift PHASE ADJUST and a control signal indicative of oscillation frequency $f_0$. As described above, control circuit 452 may set oscillation frequency $f_0$ approximately equal to the resonant frequency of resistive-inductive-capacitive sensor 402. Accordingly, as described below, control circuit 452 may be configured to determine the resonant frequency of resistive-inductive-capacitive sensor 402 during operation of resonant phase sensing system 112A, in order to modify such resonant frequency due to external parameters of resistive-inductive-capacitive sensor 402 including without limitation, sensor temperature, distance d between mechanical member 105 and inductive coil 202 (e.g., due to aging or a virtual button press), and/or externally interfering signals.

Figure 4B:
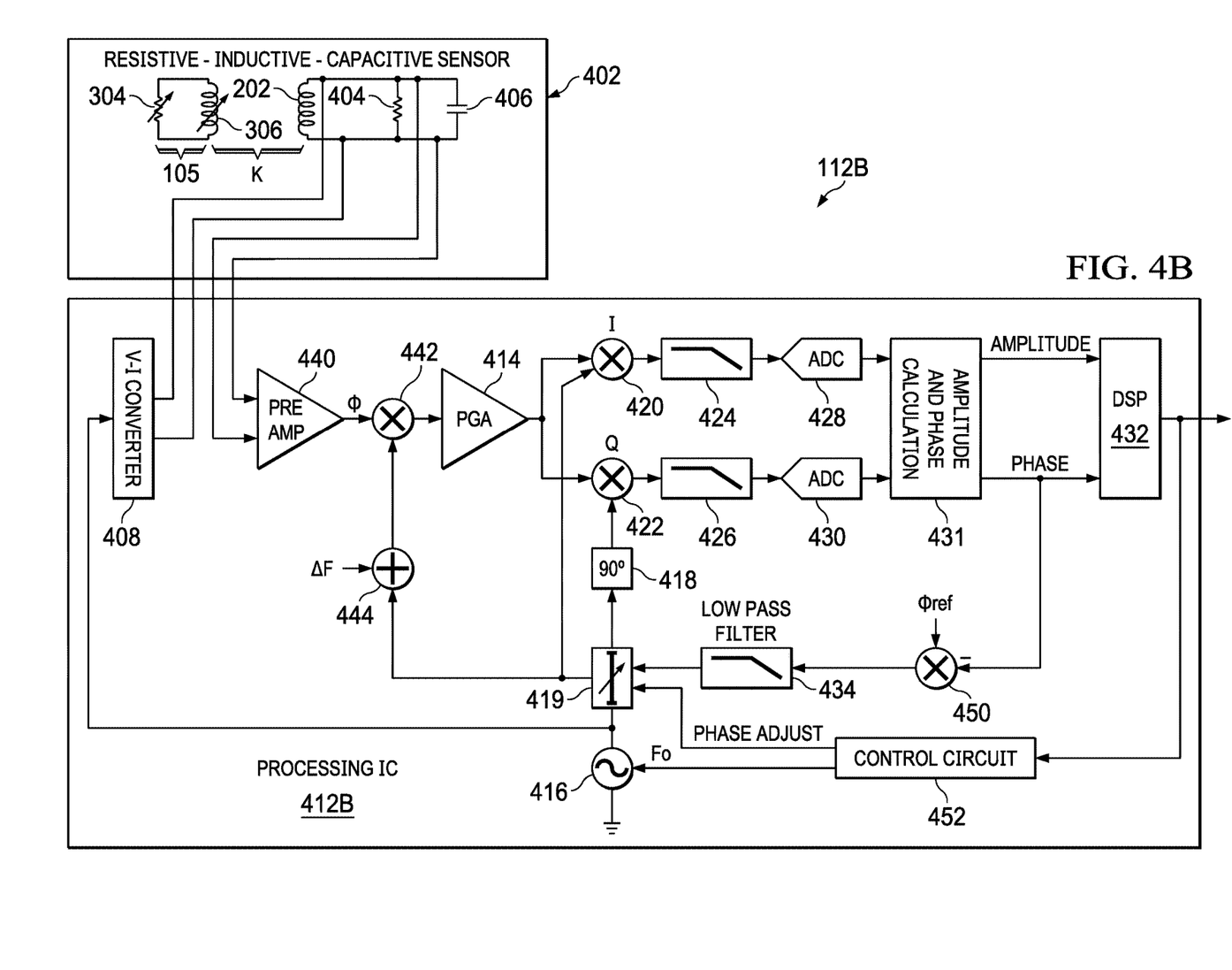

FIG. 4B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 4B may be, in many respects, similar to resonant phase sensing system 112A of FIG. 4A. Accordingly, only those differences between resonant phase sensing system 112B and resonant phase sensing system 112A may be described below. As shown in FIG. 4B, resonant phase sensing system 112B may include processing IC 412B in lieu of processing IC 412A. Processing IC 412B of FIG. 4B may be, in many respects, similar to processing IC 412A of FIG. 4A. Accordingly, only those differences between processing IC 412B and processing IC 412A may be described below.

Processing IC 412B may include variable phase shifter 419. Thus, in operation, oscillator 416 may drive a driving signal and oscillation signal which variable phase shifter 419 may phase shift to generate oscillation signals to be mixed by mixers 420 and 422. Similar to that of processing IC 412A, low-pass filter 434 may low-pass filter an error signal based on phase information extracted by amplitude and phase calculation block 431, but instead such filtered error signal may be applied to variable phase shifter 419 to modify the phase offset of the oscillation signal generated by oscillator 416, in order to drive sensor signal ϕ towards indicating a phase shift of zero. As a result, sensor signal ϕ may comprise a transient decaying signal in response to a "press" of a virtual button (or other interaction with a virtual interface) associated with resonant phase sensing system 112B as well as another transient decaying signal in response to a subsequent "release" of the virtual button (or other interaction with a virtual interface). Accordingly, low-pass filter 434 in connection with variable phase shifter 419 may implement a feedback control loop that may track changes in operating parameters of resonant phase sensing system 112B by modifying the phase shift applied by variable phase shifter 419.

Figure 4C:
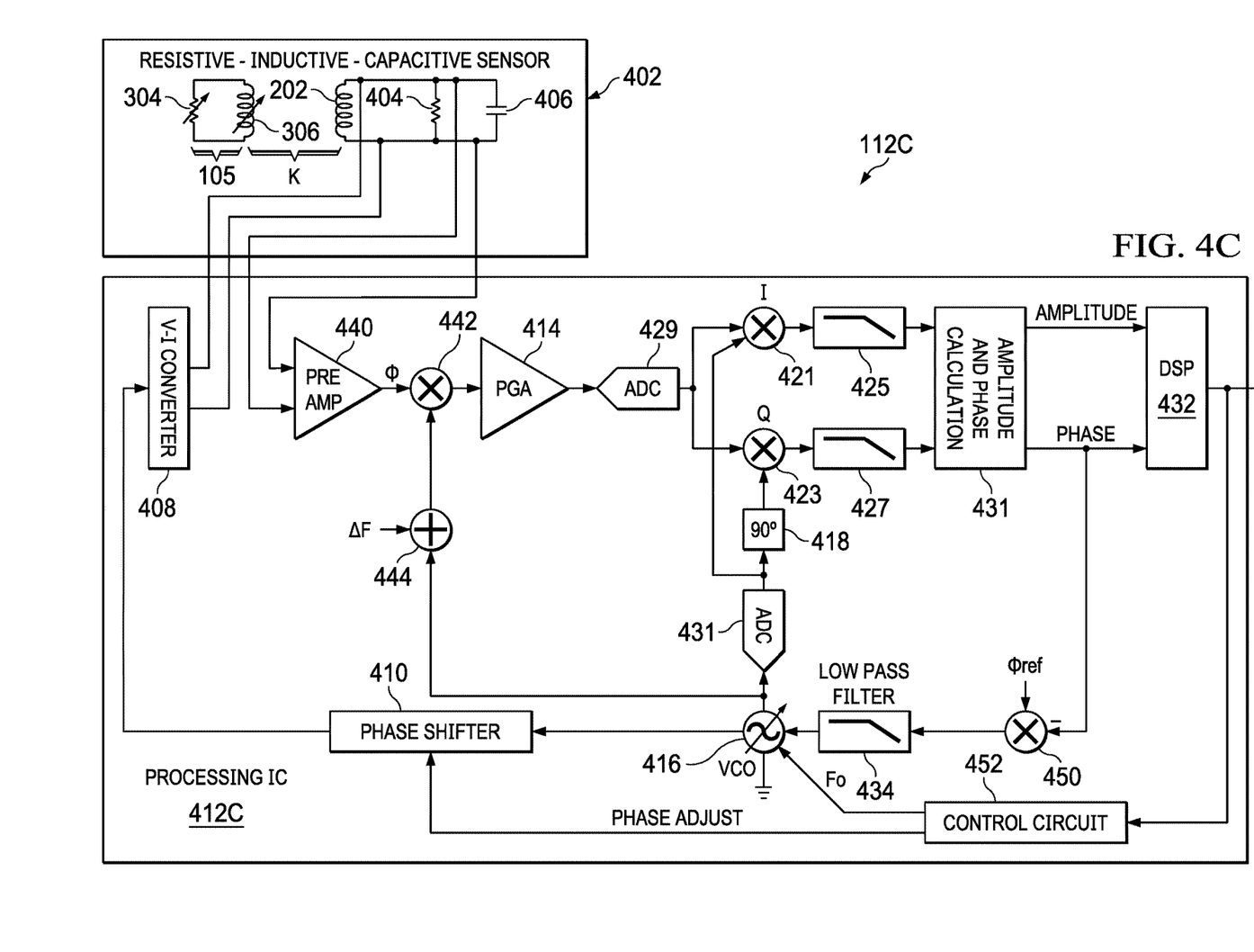

FIG. 4C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 4C may be, in many respects, similar to resonant phase sensing system 112A of FIG. 4A. Accordingly, only those differences between resonant phase sensing system 112C and resonant phase sensing system 112A may be described below. For example, a particular difference between resonant phase sensing system 112C and resonant phase sensing system 112A is that resonant phase sensing system 112C may include ADC 429 in lieu of ADC 428 and ADC 430. Accordingly, a coherent incident/quadrature detector for resonant phase sensing system 112C may be implemented with an incident channel comprising a digital mixer 421 and a digital low-pass filter 425 (in lieu of analog mixer 420 and analog low-pass filter 424) and a quadrature channel comprising a digital mixer 423 and a low-pass filter 427 (in lieu of analog mixer 422 and analog low-pass filter 426) such that processing IC 412C is configured to measure the phase information using such coherent incident/quadrature detector. Although not explicitly shown, resonant phase sensing system 112B could be modified in a manner similar to that of how resonant phase sensing system 112A is shown to be modified to result in resonant phase sensing system 112C.

Figure 5:
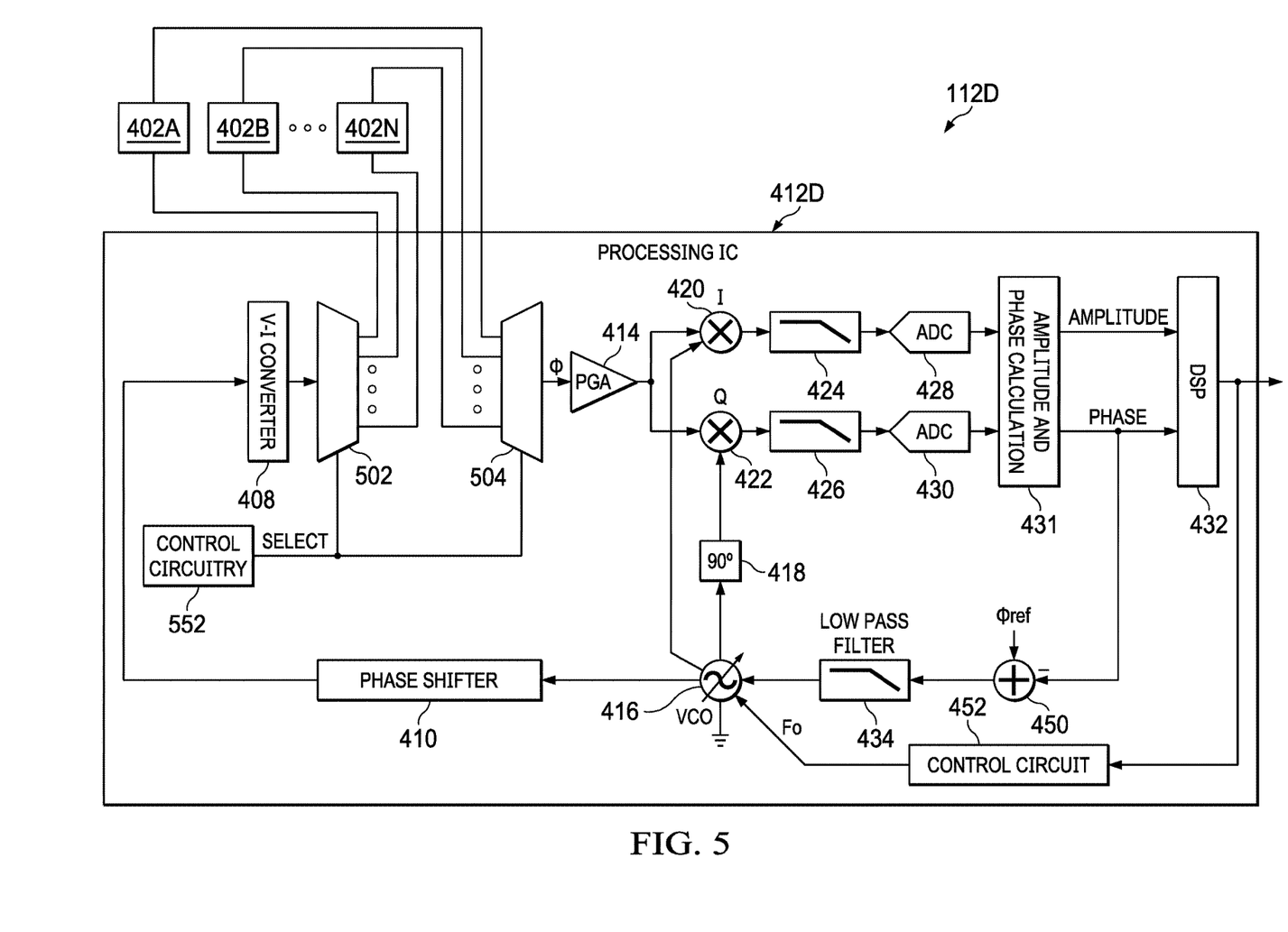
FIG. 5 illustrates a diagram of selected components of an example resonant phase sensing system implementing time-division multiplexed processing of multiple resistive-inductive-capacitive sensors, in accordance with embodiments of the present disclosure.

FIG. 5 illustrates a diagram of selected components of an example resonant phase sensing system 112D implementing time-division multiplexed processing of multiple resistive-inductive-capacitive sensors 402 (e.g., resistive-inductive-capacitive sensors 402A-402N shown in FIG. 5), in accordance with embodiments of the present disclosure. In some embodiments, resonant phase sensing system 112D may be used to implement resonant phase sensing system 112 of FIG. 1. Resonant phase sensing system 112D of FIG. 5 may be, in many respects, similar to resonant phase sensing system 112A of FIG. 4A. Accordingly, only those differences between resonant phase sensing system 112D and resonant phase sensing system 112A may be described below. In particular, resonant phase sensing system 112D may include a plurality of resistive-inductive-capacitive sensors 402 (e.g., resistive-inductive-capacitive sensors 402A-402N shown in FIG. 5) in lieu of the single resistive-inductive-capacitive sensor 402 shown in FIG. 4A. In addition, resonant phase sensing system 112D may include multiplexers 502 and 504, each of which may select an output signal from a plurality of input signals responsive to a control signal SELECT, which may be controlled by time-division multiplexing control circuitry 552.

Control circuitry 552 may comprise any suitable system, device, or apparatus configured to control time-division multiplexed sensing on one or more resistive-inductive-capacitive sensors 402, as described in greater detail below. Although FIG. 5 shows control circuitry 552 as being integral to processing IC 412D, in some embodiments, control circuitry 552 may be implemented by controller 103 or another suitable component of mobile device 102.

Accordingly, while in some embodiments a device such as mobile device 102 may comprise a plurality of resistive-inductive-capacitive sensors 402 which may be simultaneously driven and separately processed by a respective processing IC, in other embodiments, a resonant phase sensing system (e.g., resonant phase sensing system 112D) may drive resistive-inductive-capacitive sensors 402 in a time-division multiplexed manner Such approach may reduce power consumption and device size as compared with multiple-sensor implementations in which the multiple sensors are simultaneously driven and/or sensed. Device size may be reduced by time-division multiplexing multiple sensors into a single driver and measurement circuit channel, wherein only a single driver and a single measurement circuit may be required, thus minimizing an amount of integrated circuit area needed to perform driving and measurement. In addition, by leveraging a single driver and measurement circuit, no calibration may be needed to adjust for mismatches and/or errors between different drivers and/or different measurement circuits.

For purposes of clarity and exposition, preamplifier 440, mixer 442, and combiner 444 have been excluded from FIG. 5. However, in some embodiments, processing IC 412D may include preamplifier 440, mixer 442, and combiner 444 similar to that depicted in FIGS. 4A-4C.

In resonant phase sensing system 112D, control circuitry 552 may provide control of control signal SELECT in order to, for a first duration of a scan period, select a first resistive-inductive-capacitive sensor (e.g., resistive-inductive-capacitive sensor 402A) to be driven by voltage-to-current converter 408 and measured by the measurement circuit implemented by processing IC 412D. During such first duration, control circuitry 552 may place resistive-inductive-capacitive sensors other than resistive-inductive-capacitive sensor 402A in a low-impedance state. Similarly, during a second duration of the scan period, control circuitry 552 may provide control of control signal SELECT in order to select a second resistive-inductive-capacitive sensor (e.g., resistive-inductive-capacitive sensor 402B) to be driven by voltage-to-current converter 408 and measured by the measurement circuit implemented by processing IC 412D. During such second duration, control circuitry 552 may place resistive-inductive-capacitive sensors other than resistive-inductive-capacitive sensor 402B in a low-impedance state. A similar process may allow for sensing other resistive-inductive-capacitive sensors 402 in other durations of the scan period. Such an approach may minimize power consumption within unselected resistive-inductive-capacitive sensors 402.

Although not explicitly shown, resonant phase sensing system 112B could be modified in a manner similar to that of how resonant phase sensing system 112A is shown to be modified to result in resonant phase sensing system 112D, such that resonant phase sensing system 112B could implement time-division multiplexed sensing on a plurality of resistive-inductive-capacitive sensors 402. Similarly, although not explicitly shown, resonant phase sensing system 112C could be modified in a manner similar to that of how resonant phase sensing system 112A is shown to be modified to result in resonant phase sensing system 112D, such that resonant phase sensing system 112C could implement time-division multiplexed sensing on a plurality of resistive-inductive-capacitive sensors 402.

Figure 6:
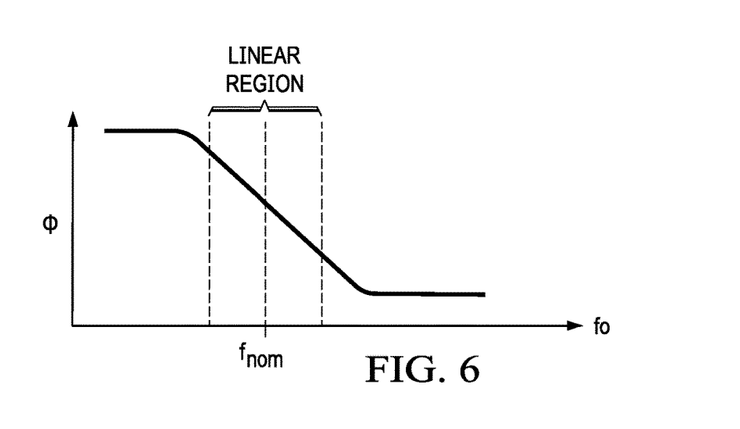
FIG. 6 illustrates an example plot of phase versus driving frequency for a resistive-inductive-capacitive sensor, in accordance with embodiments of the present disclosure.

FIG. 6 illustrates an example plot of phase ϕ versus driving frequency $f_0$ for a resistive-inductive-capacitive sensor 402, in accordance with embodiments of the present disclosure. As shown in FIG. 6, a nominal operating frequency $f_{nom}$ for oscillator 416 is chosen so as to operate at or near a resonant frequency of resistive-inductive-capacitive sensor 402, such that operation is within a linear region of phase ϕ versus driving frequency $f_0$ in which phase ϕ varies approximately linearly with variances in driving frequency $f_0$. Operation in such range may ensure that any change in inductance of resistive-inductive-capacitive sensor 402 is proportionately reflected in a change in phase ϕ, with the proportionality factor being a slope of phase ϕ versus driving frequency $f_0$. Operating at a driving frequency $f_0$ too far from the resonant frequency and in a non-linear region of the phase-versus-frequency curve may cause a smaller phase change as a function of inductive change, thus reducing measurement sensitivity. Hence, operation in the non-linear range may be sub-optimal and thus, undesirable.

While driving frequency $f_0$ may originally be set at nominal operating frequency $f_{nom}$, the resonant frequency of resistive-inductive-capacitive sensor 402 may change, due to a virtual button press upon resistive-inductive-capacitive sensor 402, sensor temperature, distance d between mechanical member 105 and inductive coil 202 (e.g., due to aging), and/or externally interfering signals. In some instances, such change in resonant frequency may cause the nominal operating frequency $f_{nom}$ to vary greatly from the resonant frequency, causing sub-optimal operation in the non-linear region of the phase-versus-frequency curve of resistive-inductive-capacitive sensor 402.

Figure 7:
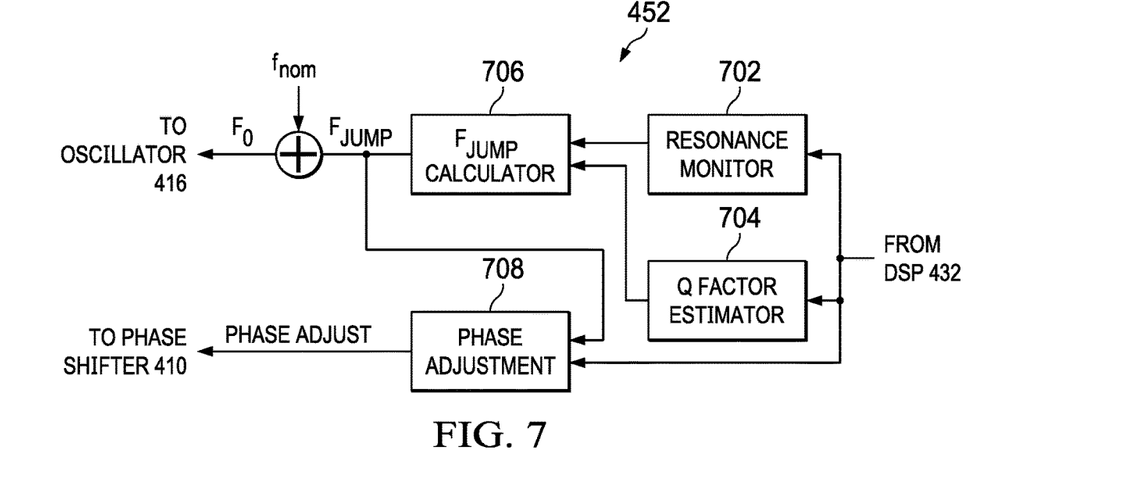
FIG. 7 illustrates a block diagram of selected components of an example control circuit of a resonant phase sensing system, in accordance with embodiments of the present disclosure.

FIG. 7 illustrates a block diagram of selected components of example control circuit 452 of a resonant phase sensing system 112, in accordance with embodiments of the present disclosure. As shown in FIG. 7, control circuit 452 may include a resonance monitor 702, a quality (Q) factor estimator 704, a frequency change calculator 706, and a phase adjustment block 708. In some embodiments, some or all of functionality of control circuit 452 may be performed by DSP 432.

Resonance monitor 702 may comprise any system, device, or apparatus configured to detect a change in resonance of resistive-inductive-capacitive sensor 402 from driving frequency $f_0$ that is in excess of a threshold change.

Q factor estimator 704 may comprise any system, device, or apparatus configured to estimate a quality (Q) factor of resistive-inductive-capacitive sensor 402 based on phase information and/or based on amplitude information associated with resistive-inductive-capacitive sensor 402. For example, a Q factor may be estimated by either measuring a change in phase versus frequency or a change in amplitude versus frequency. In some embodiments, Q factor estimator 704 may be implemented in a manner similar to that disclosed in U.S. patent application Ser. No. 16/294,217, filed Mar. 6, 2019, and incorporated by reference in its entirety.

Frequency change calculator 706 may comprise any system, device, or apparatus configured to, based on signals output by resonance monitor 702 and Q factor estimator 704, calculate a frequency change $f_{JUMP}$ from nominal frequency $f_{nom}$ needed to center driving frequency $f_0$ at the resonant frequency of resistive-inductive-capacitive sensor 402.

Phase adjustment block 708 may comprise any system, device, or apparatus configured to, based on frequency change $f_{JUMP}$ and phase measurement information from DSP 432, determine a phase adjustment to be applied by phase shifter 410 or phase shifter 419 to phase shift the oscillation signal generated by oscillator 416 such that at driving frequency $f_0$ of resonant phase sensing system 112, an incident component of a sensor signal ϕ generated by pre-amplifier 440 is approximately equal to a quadrature component of sensor signal ϕ, so as to provide common mode noise rejection by the phase detector implemented by processing IC 412.

Operation of the components of control circuit 452 may be further illustrated by reference to FIG. 8 and its description below.

Figure 8:
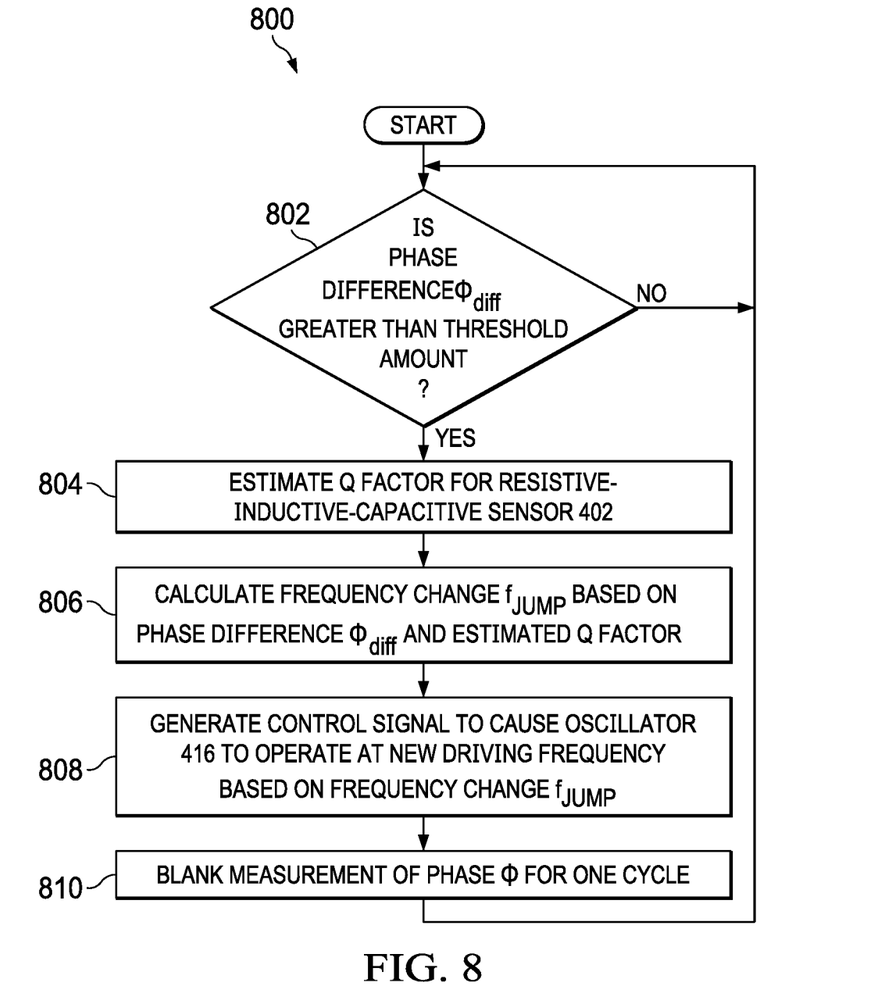
FIG. 8 illustrates a flow chart of an example method for auto-centering of sensor frequency of a resonant sensor, in accordance with embodiments of the present disclosure.

FIG. 8 illustrates a flow chart of an example method 800 for auto-centering of sensor frequency of a resonant sensor, in accordance with embodiments of the present disclosure. According to certain embodiments, method 800 may begin at step 802. As noted above, teachings of the present disclosure may be implemented in a variety of configurations of resonance phase sensing system 112. As such, the preferred initialization point for method 800 and the order of the steps comprising method 800 may depend on the implementation chosen. In these and other embodiments, method 800 may be implemented as firmware, software, applications, functions, libraries, or other instructions.

At step 802, resonance monitor 702 may monitor to determine if a phase difference $\phi_{diff}$ between a measured phase $\phi_{meas}$ differs from an initial phase $\phi_{init}$ by more than a threshold amount, wherein such initial phase $\phi_{init}$ is a measured phase $\phi$ that may occur when driving frequency $f_0$ is at nominal frequency $f_{nom}$ and no interaction (e.g., virtual button press) is taking place with respect to resistive-inductive-capacitive sensor 402. Such threshold amount may be selected to be sufficiently small such that auto-centering of sensor frequency occurs prior to sub-optimal operation occurring outside of the linear region of the phase-versus-frequency curve for resistive-inductive-capacitive sensor 402. In these and other embodiments, such threshold value may be dynamically varied based on a sensor Q factor (e.g., threshold value may be higher for larger Q factors). If difference $\phi_{diff}$ is greater than the threshold amount, method 800 may proceed to step 804. Otherwise, method 800 may remain at step 802 until difference $\phi_{diff}$ is greater than the threshold amount.

Although the foregoing paragraph contemplates a phase difference $\phi_{diff}$ exceeding a threshold as a trigger for performing auto-centering, one or more other triggers may be used in lieu of or in addition to the phase difference $\phi_{diff}$ exceeding a threshold, including without limitation: an external triggering signal, periodic auto-centering at a predetermined rate, a change in Q factor exceeding a predetermined threshold, phase difference $\phi_{diff}$ exceeding its respective threshold for a threshold number of successive phase measurements, phase difference $\phi_{diff}$ exceeding its respective threshold for a threshold period of time, and/or a filtered version of phase difference $\phi_{diff}$ exceeding its respective threshold.

At step 804, Q factor estimator 704 may estimate a Q factor for resistive-inductive-capacitive sensor 402. For example, Q factor estimator 704 may measure phase $\phi$ at two different driving frequencies $f_0$ to estimate the Q factor.

At step 806, frequency change calculator 706 may calculate frequency change $f_{JUMP}$ from nominal frequency $f_{nom}$ needed to center driving frequency $f_0$ at the resonant frequency of resistive-inductive-capacitive sensor 402. In some embodiments, frequency change $f_{JUMP}$ may be calculated as a ratio of phase difference $\phi_{diff}$ and a slope $\phi_{slope}$ of the phase-versus-frequency curve of resistive-inductive-capacitive sensor 402, which slope $\phi_{slope}$ may be derived from the estimated Q factor. For example, such slope may be estimated as:

$$\phi_{slope} = -\frac{Q}{2\pi f_0} \frac{2Q^2 + 1}{Q^2 + 1}$$

where Q is the estimated Q factor.

At step 808, control circuit 452 may generate a control signal based on nominal frequency $f_{nom}$ and frequency change $f_{JUMP}$ to cause oscillator 416 to operate at driving frequency $f_0 = f_{nom} + f_{JUMP}$. In embodiments in which oscillator 416 is implemented by a VCO, control circuit 452 may appropriately alter a control voltage communicated as the control signal to oscillator 416 such that oscillator 416 outputs driving frequency $f_0 = f_{nom} + f_{JUMP}$. In embodiments in which oscillator 416 is implemented by a DCO, control circuit 452 may appropriately alter a digital control code communicated as the control signal to oscillator 416 such that oscillator 416 outputs driving frequency $f_0 = f_{nom} + f_{JUMP}$.

At step 810, control circuit 452 may cause measurement of phase $\phi$ to be blanked for one cycle after a change in driving frequency $f_0$ occurs and may ensure that the phase information change caused by the modification of the driving frequency is not communicated to downstream processing (e.g., by holding the previously-sampled measurement and communicating the previously-sampled measurement to downstream processing for one cycle), in order to prevent inconsistent phase information from being reported. After completion of step 810, method 800 may proceed again to step 802.

Although FIG. 8 discloses a particular number of steps to be taken with respect to method 800, method 800 may be executed with greater or fewer steps than those depicted in FIG. 8. For example, in some embodiments, method 800 may include a step whereby a verification cycle may ensure that the phase $\phi$ after auto-centering is close to its initial phase $\phi_{init}$. In these and other embodiments, method 800 may include a step whereby an additional Q factor estimation may be performed after auto-centering to ensure operation in the linear portion of the phase-versus-frequency curve of resistive-inductive-capacitive sensor 402. In these and other embodiments, method 800 may include one or more steps having cycles to calibrate initial phase $\phi_{init}$ against parameter variations (e.g., temperature, mechanical deformations, etc.).

In addition, although FIG. 8 discloses a certain order of steps to be taken with respect to method 800, the steps comprising method 800 may be completed in any suitable order.

Method 800 may be implemented using a resonance phase sensing system 112, components thereof or any other system operable to implement method 800. In certain embodiments, method 800 may be implemented partially or fully in software and/or firmware embodied in computer-readable media.

Although the foregoing contemplates use of closed-loop feedback for sensing of displacement, the various embodiments represented by FIGS. 4A-5 may be modified to implement an open-loop system for sensing of displacement. In such an open-loop system, a processing IC may include no feedback path from amplitude and phase calculation block 431 to oscillator 416 or variable phase shifter 419 and thus may also lack a feedback low-pass filter 434. Thus, a phase measurement may still be made by comparing a change in phase to a reference phase value, but the oscillation frequency driven by oscillator 416 may not be modified or the phase shifted by variable phase shifter 419 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 432 may be capable of processing phase information to make a binary determination of whether physical interaction associated with a human-machine interface associated with mechanical member 105 has occurred and/or ceased to occur, in some embodiments, DSP 432 may quantify a duration of a displacement of mechanical member 105 to more than one detection threshold, for example to detect different types of physical interactions (e.g., a short press of a virtual button versus a long press of the virtual button). In these and other embodiments, DSP 432 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a resistive-inductive-capacitive sensor;
   a driver configured to drive the resistive-inductive-capacitive sensor at a driving frequency; and
   a measurement circuit communicatively coupled to the resistive-inductive-capacitive sensor and configured to:
      determine a measured change in a resonant frequency of the resistive-inductive-capacitive sensor; and
      based on the measured change, modify the driving frequency when the measured change exceeds a threshold value.

2. The system of claim 1, wherein the threshold value is based on a quality factor of the resistive-inductive-capacitive sensor.

3. The system of claim 1, wherein the measurement circuit further comprises a quality factor estimator configured to estimate a quality factor of the resistive-inductive-capacitive sensor.

4. The system of claim 3, wherein the quality factor estimator is configured to estimate the quality factor based on at least one of phase information associated with the resistive-inductive-capacitive sensor and amplitude information associated with the resistive-inductive-capacitive sensor.

5. The system of claim 3, wherein the measurement circuit is further configured to modify the driving frequency based on the quality factor.

6. The system of claim 1, wherein the measurement circuit is configured to modify the driving frequency by:
   determining a change in phase information associated with the resistive-inductive-capacitive sensor; and
   adjusting the driving frequency by a frequency change based on the phase information and a slope of a phase-versus-frequency curve of the resistive-inductive-capacitive sensor.

7. The system of claim 6, wherein the measurement circuit is configured to calculate the frequency change to be equal to the change in phase information divided by the slope.

8. The system of claim 7, wherein:
   the measurement circuit further comprises a quality factor estimator configured to estimate a quality factor of the resistive-inductive-capacitive sensor; and the measurement circuit is configured to calculate the slope based on the quality factor.

9. The system of claim 1, wherein the measurement circuit is configured to modify the driving frequency to match a resonance frequency of the resistive-inductive-capacitive sensor.

10. The system of claim 1, wherein the measurement circuit is configured to verify that modification of the drive frequency results in the drive frequency matching a resonance frequency of the resistive-inductive-capacitive sensor.

11. The system of claim 1, wherein the measurement circuit is configured to modify the driving frequency such that the system operates in a linear region of a phase-versus-frequency curve of the resistive-inductive-capacitive sensor.

12. The system of claim 1, wherein the measurement circuit is configured to:
blank measurement of phase information of the resistive-inductive-capacitive sensor for a measurement cycle following modification of the driving frequency; and
ensure that the phase information change caused by the modification of the driving frequency is not communicated to downstream processing.

13. The system of claim 1, wherein the measurement circuit is configured to:
measure phase information associated with the resistive-inductive-capacitive sensor; and
based on the phase information, determine a displacement of a mechanical member relative to the resonant sensor, wherein the displacement of the mechanical member causes a change in an impedance of the resonant sensor.

14. A method comprising, in a system comprising a resistive-inductive-capacitive sensor and a driver configured to drive the resistive-inductive-capacitive sensor at a driving frequency:
determining a measured change in a resonant frequency of the resistive-inductive-capacitive sensor; and
based on the measured change, modifying the driving frequency when the measured change exceeds a threshold value.

15. The method of claim 14, wherein the threshold value is based on a quality factor of the resistive-inductive-capacitive sensor.

16. The method of claim 14, further comprising estimating a quality factor of the resistive-inductive-capacitive sensor.

17. The method of claim 16, further comprising estimating the quality factor based on at least one of phase information associated with the resistive-inductive-capacitive sensor and amplitude information associated with the resistive-inductive-capacitive sensor.

18. The method of claim 16, further comprising modifying the driving frequency based on the quality factor.

19. The method of claim 14, further comprising modifying the driving frequency by:
determining a change in phase information associated with the resistive-inductive-capacitive sensor; and
adjusting the driving frequency by a frequency change based on the phase information and a slope of a phase-versus-frequency curve of the resistive-inductive-capacitive sensor.

20. The method of claim 19, further comprising calculating the frequency change to be equal to the change in phase information divided by the slope.

21. The method of claim 20, further comprising:
estimating a quality factor of the resistive-inductive-capacitive sensor; and
calculating the slope based on the quality factor.

22. The method of claim 14, further comprising modifying the driving frequency to match a resonance frequency of the resistive-inductive-capacitive sensor.

23. The method of claim 14, further comprising verifying that modification of the drive frequency results in the drive frequency matching a resonance frequency of the resistive-inductive-capacitive sensor.

24. The method of claim 14, further comprising modifying the driving frequency such that the system operates in a linear region of a phase-versus-frequency curve of the resistive-inductive-capacitive sensor.

25. The method of claim 14, further comprising:
blanking measurement of phase information of the resistive-inductive-capacitive sensor for a measurement cycle following modification of the driving frequency; and
ensuring that the phase information change caused by the modification of the driving frequency is not communicated to downstream processing.

26. The method of claim 14, further comprising:
measuring phase information associated with the resistive-inductive-capacitive sensor; and
based on the phase information, determining a displacement of a mechanical member relative to the resonant sensor, wherein the displacement of the mechanical member causes a change in an impedance of the resonant sensor.

27. An integrated circuit comprising:
a measurement circuit configured to communicatively couple to a resistive-inductive-capacitive sensor driven at a driving frequency, the measurement circuit further configured to:
determine a measured change in a resonant frequency of the resistive-inductive-capacitive sensor; and
based on the measured change, modify the driving frequency when the measured change exceeds a threshold value.

* * * * *